United States Patent
Lorenzen et al.

(10) Patent No.: US 6,480,514 B1
(45) Date of Patent: Nov. 12, 2002

(54) DEVICE FOR COOLING DIODE LASERS

(75) Inventors: Dirk Lorenzen, Jena; Franz Daiminger, Hirschberg Grossachsen, both of (DE)

(73) Assignee: JENOPTIK Aktiengesellschaft, Jena (DE)

( * ) Notice: Subject to any disclaimer, the term of this patent is extended or adjusted under 35 U.S.C. 154(b) by 174 days.

(21) Appl. No.: 09/693,411

(22) Filed: Oct. 20, 2000

(30) Foreign Application Priority Data

Oct. 21, 1999 (DE) .......................................... 199 51 330
Sep. 21, 2000 (DE) .......................................... 100 47 780

(51) Int. Cl.$^7$ ................................................ H01S 3/04
(52) U.S. Cl. ........................................................ 372/35
(58) Field of Search .............................. 372/34, 35, 50; 357/74, 81, 82

(56) References Cited

U.S. PATENT DOCUMENTS 5,105,429 A * 4/1992 Mundinger et al. ........... 372/34
5,105,430 A * 4/1992 Mundinger et al. ........... 372/35

FOREIGN PATENT DOCUMENTS

| DE | 43 15 580 A1 | 11/1994 |
| DE | 197 50 879 A1 | 6/1998 |
| DE | 197 10 716 A1 | 9/1998 |
| DE | 198 53 750 A1 | 2/2000 |

OTHER PUBLICATIONS

English Abstract of DE 198 53 750 A1.
English Abstract of DE 43 15 580 A1.
English Abstract of DE 197 50 879 A1.
English Abstract of DE 197 10 716 A1.

* cited by examiner

Primary Examiner—Leon Scott, Jr.
(74) Attorney, Agent, or Firm—Reed Smith LLP

(57) ABSTRACT

In a device for cooling diode lasers, it is aimed to increase the heat transfer coefficient, with a low overall height of the device, in such a manner that the pressure losses occurring also effectively ensure that stacked heat sinks are operated in parallel in terms of flow. Channels arranged in superimposed planes are divided, in each plane, into groups which are flow-connected in series and, in order to be connected in series, open out into flow-connecting links which are common to the superimposed planes. The device is suitable as a heat sink for diode lasers, in particular for cooling diode laser arrays and stacks thereof.

12 Claims, 10 Drawing Sheets

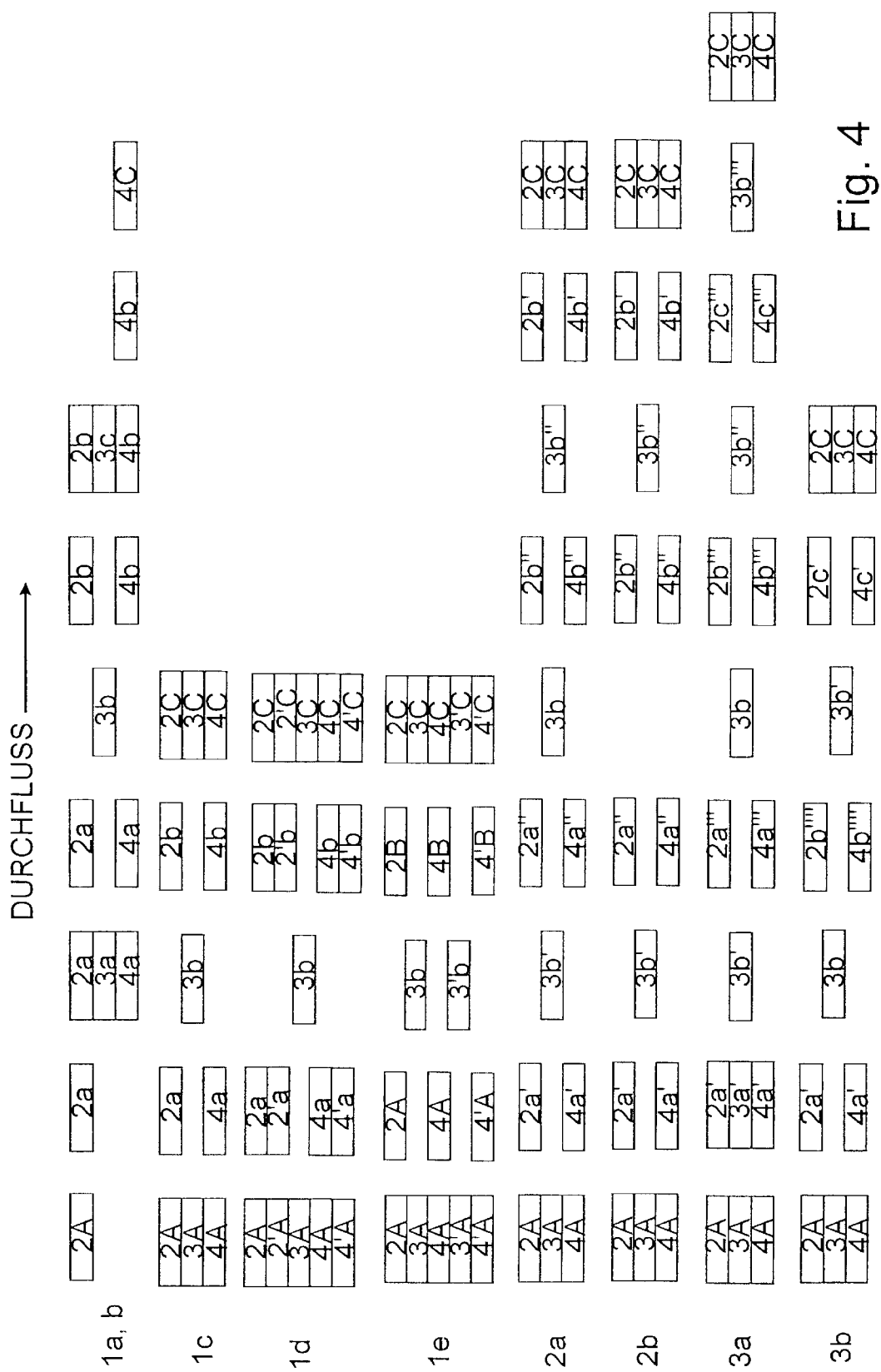

DEVICE FOR COOLING DIODE LASERS

BACKGROUND OF THE INVENTION a) Field of the Invention

The invention relates to a device for cooling diode lasers, having channels which are arranged in superimposed planes and through which a cooling liquid flows.

The device is suitable as a heat sink for diode lasers, in particular for cooling diode laser arrays and stacks thereof.

b) Description of the Related Art

It is known that the use of high-power diode lasers always requires cooling, which can be achieved particularly efficiently by fluid-dynamic micro-channel cooling using water as the cooling liquid. Thus, considerable surface areas for the introduction of heat are achieved with so-called microchannel heat sinks in which the microchannels are made in a material with a good thermal conductivity using various methods.

The multiplicity of known microchannel heat sinks comprises different functional planes in a sequence of assembled, structured layers, the object which is to be cooled being arranged on an upper covering layer, for example by soldering. In addition to the covering, the layer structure also includes the functions of supplying and discharging the cooling liquid and the actual cooling via the microchannels.

For example, in a microchannel heat sink of the type described in DE 43 15 580, these functions are distributed over five layers. In a microchannel or distributor plate, the cooling liquid supplied via an inlet is distributed to the microchannels, which are situated beneath the diode laser attached to the covering layer. The cooling liquid is passed into a collecting plate via collecting channels in an intermediate layer, and from this collecting plate there is a connection to an outlet. A baseplate closes off the microchannel heat sink at the bottom. The modular structure is in principle suitable for vertical stacking.

Stackable systems are also described in U.S. Pat. Nos. 5,105,429 and 5,105,430, in which the cooling liquid is passed through the stack in continuous paths. Each of the microchannel heat sinks present in the stack comprises a multilayer structure having microchannels in the upper layer and has inlets and outlets which are connected to the continuous paths. In U.S. Pat. No. 5,105,430, the coolant does not flow parallel to the direction in which light is emitted from the installed laser array, but rather transversely to this direction, in the width direction of the microchannel heat sink. The cooling liquid is supplied to the center of the microchannels and leaves them in two directions. A drawback is the low flow velocity which occurs in the microchannels since the cross section of the microchannels is larger than that of the inlet, on account of the microchannels being connected in parallel.

With the multilayer distribution described in DE 197 50 879, the microchannels which are relevant for cooling are made in an upper and a lower layer and are connected by channels in a separating layer in such a manner that the cooling liquid initially passes through the microchannels in one plane and then through the microchannels in the other plane. In this case too, a drawback is the low flow velocity in the channels, since the flow cross section of the channel's structure over branched groove patterns and taking the separating layer into account is greater than the cross section of the inlets or outlets.

Working on the basis of DE 43 15 580, a solution in accordance with DE 197 10 716 was based on the object of considerably reducing the pressure loss which the cooling liquid undergoes as it passes through the microchannel heat sink. For this purpose, the intermediate plate is modified by a layered arrangement in such a manner that the cross section of flow is successively adapted by means of a stepped structure.

The increase in the overall height which is caused by the layered arrangement has a particularly adverse effect for applications in which it is aimed to achieve large optical area power densities by means of a stacked arrangement of the diode lasers.

To summarize, it has to be stated that the measures aimed at improving the quality of microchannel heat sinks are not sufficiently satisfactory. In particular, they have adverse effects on stacks of heat sinks of this nature which are operated in parallel in terms of flow and in which an increase in the flow rate which is proportional to the number of heat sinks increases the pressure losses to an unacceptable extent.

OBJECT AND SUMMARY OF THE INVENTION

Therefore, the invention is based on the primary object of increasing the heat transfer coefficient, with a low overall height of the device, in such a manner that the pressure losses occurring also effectively ensure that stacked heat sinks are operated in parallel in terms of flow. In doing so, it should be taken into account that the thermal resistance and pressure losses, on account of their effect on the flow velocity of the cooling liquid, cannot be optimized independently of one another.

According to the invention, the object is solved by a device for cooling diode lasers, having channels which are arranged in superimposed planes and through which a cooling liquid flows, in that the channels in each plane are divided into groups which are flow-connected in series with one another and, in order to be connected in series, open out into flow-connecting links which are common to the superimposed planes. A first group of the groups of channels is in communication with a common inlet and another group of the group of channels, which is the last group in the series, is in communication with a common outlet for the cooling liquid.

With the aid of the inventive measures, outside the attachment area of the object to be cooled, to avoid pressure losses, the largest possible cross section of flow is used, the relatively large area available for the introduction of heat here counteracting a reduction in the heat transfer coefficient caused by a reduced flow velocity. By contrast, in the region of the flow-connecting links which serve as a collecting pool for a plurality of channels, an increased flow velocity is generated, and the partial pressure loss which occurs only in a selectable region can be accepted on account of the improved heat transfer.

Further positive effects arise as a result of the fact that the groups of channels which are flow-connected in series in one plane have the same portion of coolant flowing successively through them. Unlike when channels lying in different layers are connected in series (DE 197 50 879), it is possible to reduce the flow cross section while maintaining a constant number of channels which are approximately equivalent in terms of their cooling effect. It is thus possible, for example, to reduce the overall flow through the heat sink and the flow velocity at the inlets and outlets without an associated reduction in the flow velocity in the channels, which has a particularly beneficial effect when it is necessary to stack microchannel heat sinks. On the other hand, if the flow is kept constant, it is possible to increase the flow velocity and to improve the cooling action.

The arrangement of the groups of channels in the superimposed planes increases the area available for the introduction of heat and has a beneficial effect on increasing the flow velocity for the cooling liquid. Advantageously, the channels which are arranged in superimposed planes are formed in layers, between which there is a separating layer having the common flow-connecting links.

Since the flow-connecting links which have a common action for the planes may act as additional channels which are relevant for cooling, it is advantageous if they are arranged in the region where the principle introduction of heat occurs, beneath the object which is to be cooled.

To increase the height of the channels, the layers may be designed as multiple layers.

The channels which are relevant for cooling may be aligned in various ways. For example, it is possible for the groups of channels in the superimposed planes to be designed either for flows of coolant which are oriented parallel to one another or, at least in parts, for flows of coolant which are oriented perpendicular to one another. The first variant can be varied still further in that the flows of coolant may run parallel to the direction of emission from the diode laser or perpendicular to this direction. In the second variant, one of the flows of coolant should run in the direction of emission from the diode laser.

For functional reasons, the layers which contain the groups of channels are covered by covering layers. To achieve an improved distribution of heat, it is advantageous if an upper covering layer is provided with a step in a region for attachment of the diode laser or if the upper covering layer bears an additional layer for attachment of the diode laser. The additional layer may enflush with the upper covering layer or may also form a step, at which the covering layer projects beneath the additional layer.

The invention is to be explained in more detail below with reference to the diagrammatic drawings.

BRIEF DESCRIPTION OF THE DRAWINGS

In the drawings:

FIG. 4 shows flow diagrams for the microchannel heat sinks shown in FIGS. 1a to 3b.

DESCRIPTION OF THE PREFERRED EMBODIMENTS

Figure 1A:
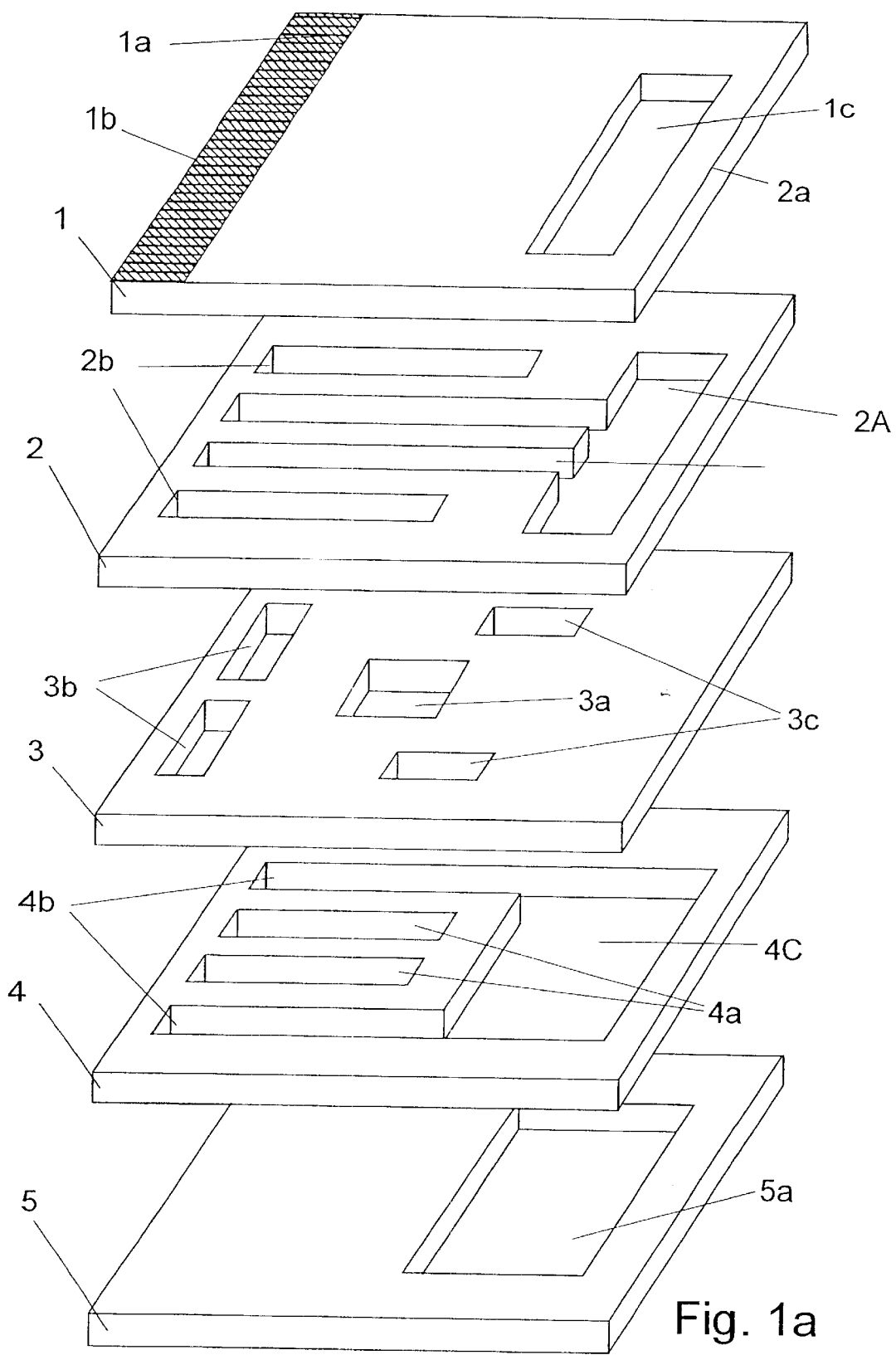
FIG. 1a shows an exploded view of a layer sequence for a microchannel heat sink in which the inlet and outlet are in separate layers.

In the case of the layers of a microchannel heat sink which are arranged in superimposed planes in FIG. 1a, an upper covering layer 1 has a mounting surface 1a, on which an object to be cooled (not shown), for example a high-power diode laser or diode laser array is mounted close to an end edge 1b. Microchannels 2a start from an inlet 2A in a cooling microchannel layer 2 which is provided for supplying a cooling liquid and for which there is a connection to a cooling-liquid source (not shown) via an opening 1c, these microchannels 2a, like the other microchannels, being only diagrammatically indicated for the sake of clarity and being illustrated in reduced number compared to what is actually the case. The microchannels 2a form a first group of channels, downstream of which a further group of microchannels 2b is connected in series in terms of flow. For this purpose, the channels of both groups open out into flow-connecting links which are made in the form of connecting channels 3b in an intermediate layer 3. Their cooling design enables the connecting channels 3b to make a significant contribution to absorbing the amounts of heat which are to be dissipated. The connecting channels 3b at the same time serve as flow-connecting links for the series connection of further groups of channels which are present as cooling microchannels 4a and 4b in a cooling microchannel layer 4 which also acts as an outlet layer and through which cooling liquid flows in parallel with the groups of channels in the cooling microchannel layer 2. The group of channels formed by the microchannels 4a is connected to the inlet 2A via a connecting channel 3a. While the group of channels connected in series downstream of the first group in the cooling microchannel structural layer 2 are in communication with an outlet 4C in the cooling microchannel layer 4 via channels 3c in the intermediate layer 3, the microchannels 4b are directly connected to the outlet. A lower covering layer 5, in which an opening 5a for discharging the cooling liquid is formed, closes off the heat sink at the bottom.

A cooling liquid which is supplied via the inlet 2A initially enters the first group of channels in the layers 2 and 4, specifically the microchannels 2a by a direct path and the microchannels 4a via the channel 3a in the intermediate layer 3. Since the connecting channels 3b are used jointly by the microchannels 2a, 2b of the cooling microchannel layer 2 and the microchannels 4a, 4c of the cooling microchannel structural layer 4, the flow velocity of the cooling liquid in this way rises in a selected region which is determined by the arrangement of the connecting channels 3b, and therefore the heat transfer taking place in that region also rises. Therefore, it is advantageous if, as in the present exemplary embodiment, the connecting channels 3b in the region where the principle introduction of heat takes place are arranged beneath the mounting surface 1a and therefore the object to be cooled. The cooling liquid which enters the connecting channels 3b from the microchannels 2a and 4a is dispersed to the microchannels 2b and 4b, respectively, from where, via the channels 3c, it flows out indirectly or directly into the outlet 4C.

Figure 1B:
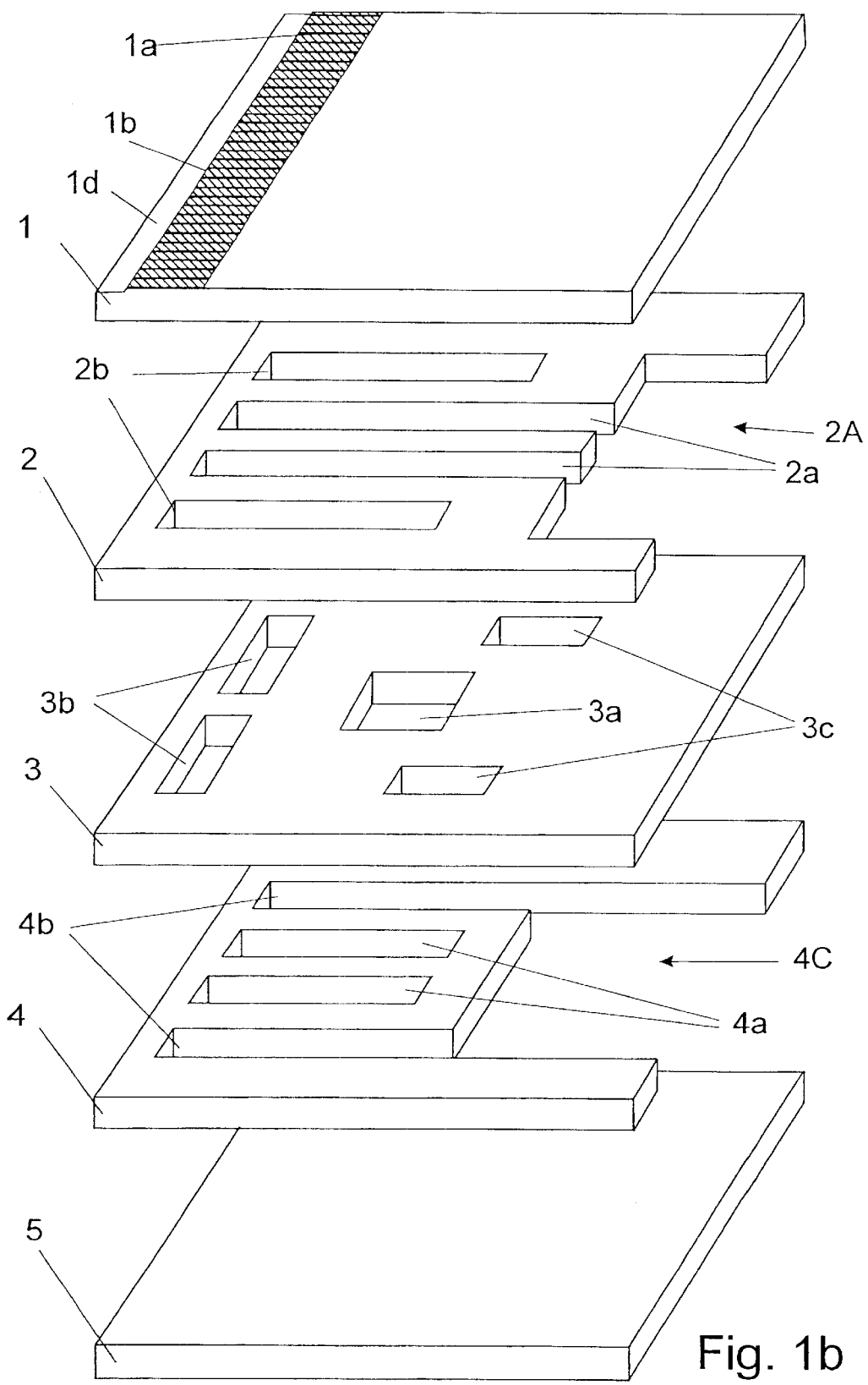
FIG. 1b shows a modified microchannel heat sink in accordance with FIG. 1a, with a direct connection to the liquid supply and discharge in the separate layers.

The modified microchannel heat sink shown in FIG. 1b is of an identical structure in terms of flow to the embodiment shown in FIG. 1a. In this figure, the holding region for the object to be cooled is of different design, in that the mounting surface 1a is set back by the width of a step 1d. That region of the heat sink which projects with respect to the mounted diode laser by the width of the step has a positive effect on the dissipation of heat, on account of the heat distribution which it brings about.

Figure 1C:
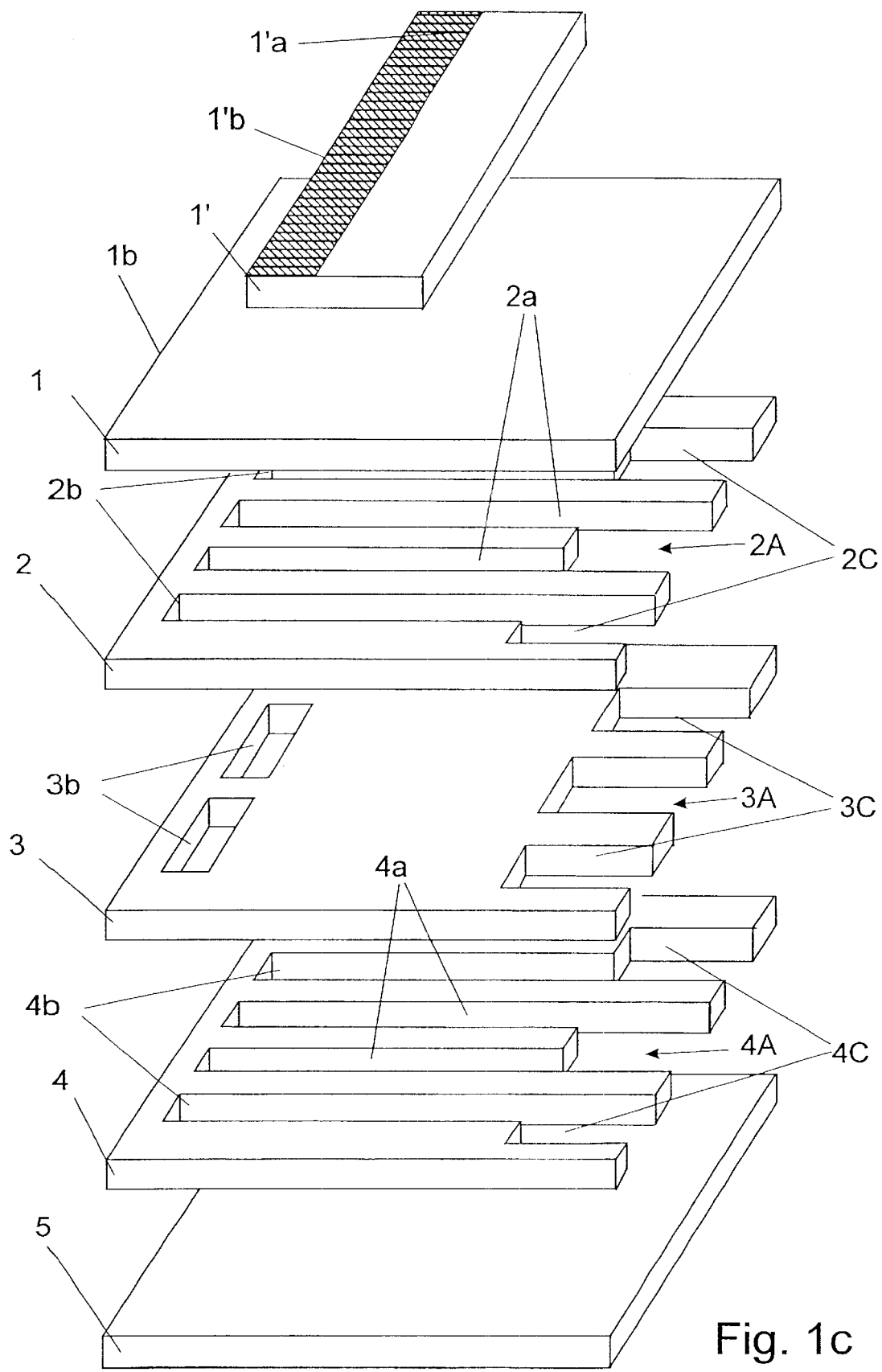
FIG. 1c shows an exploded view of a layer sequence with an inlet and an outlet which are both passed through the illustrated layers of the microchannel heat sink.

The layer sequence illustrated in FIG. 1c dispenses with the channels 3a and 3c in the intermediate layer 3. Instead, cutouts 2A, 3A and 4A and 2C, 3C and 4C are formed in the individual layers 2, 3 and 4, these cutouts forming continuous channels for the inlet 2A–3A–4A and the outlet 2C–3C–4C when the layers 2, 3 and 4 are joined together. On top of the covering layer 1 there is a further layer 1', which is produced from a material with a higher thermal conductivity than the remaining material of the heat sink. The object to be cooled is mounted on a mounting surface 1'a close to an end edge 1'b which is either flush with the end edge 1b or forms a similar step with the latter to that shown in FIG. 1b. In this case, the step is designed in such a manner that the covering layer 1 projects beneath the additional layer 1'.

Figure 1D:
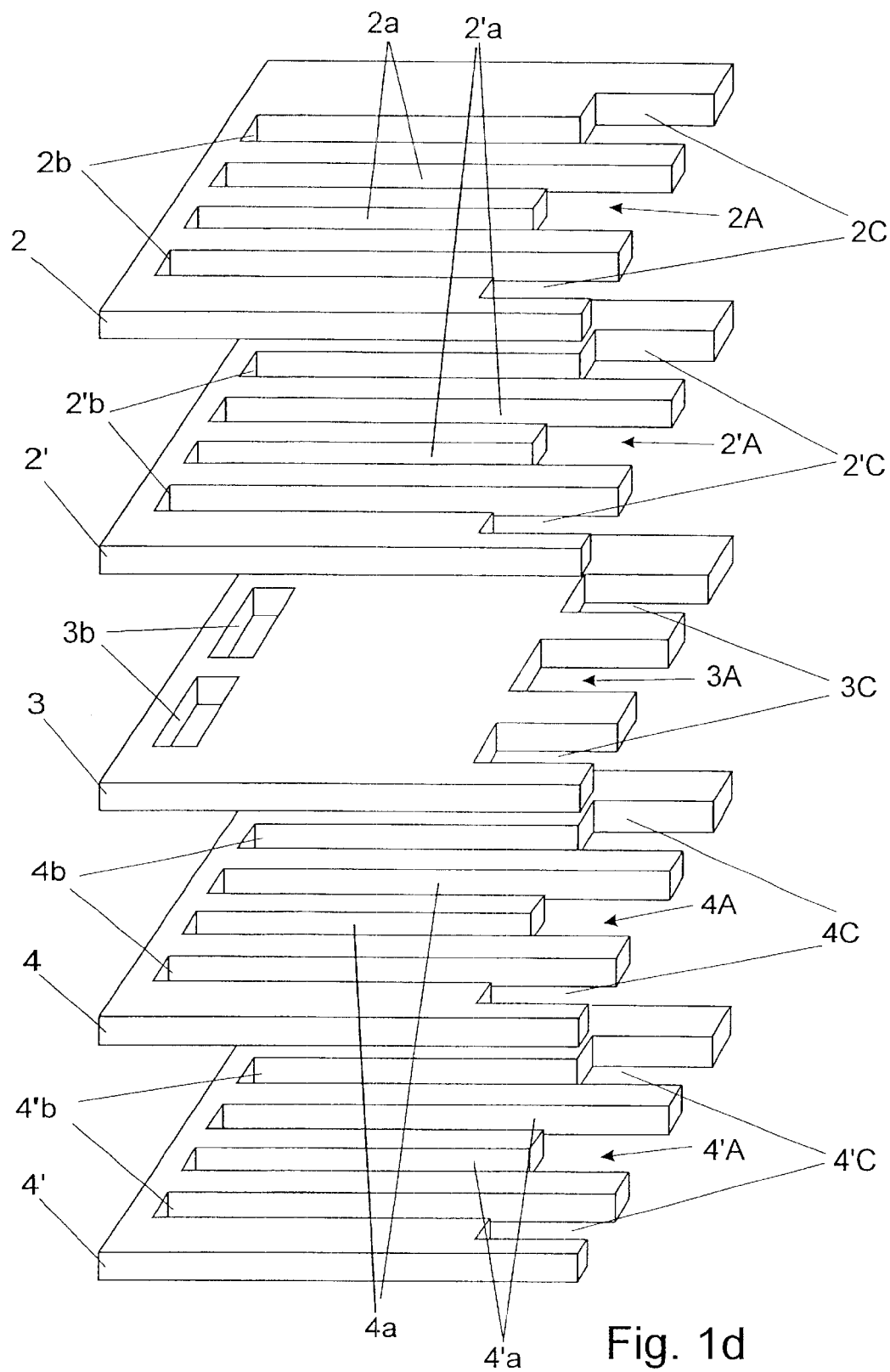
FIG. 1d shows a layer sequence in accordance with FIG. 1c, in which the groups of channels of each plane extend over a plurality of layers.

In a further modification shown in FIG. 1d, instead of the layers which were previously individually present in the superimposed planes, there are now two identical cooling microchannel layers 2 and 2' and 4 and 4' one above the other, the structural elements in the layers 2' and 4', in a similar way to the designation of the layers, having been denoted with an additional prime symbol. Connected in pairs over a large surface area, these layers have an increased channel height, with the result that the thermal resistance is reduced on account of the increased heat transfer area. If the microchannels are also made narrower, the thermal properties of the microchannel heat sink are improved further.

Figure 1E:
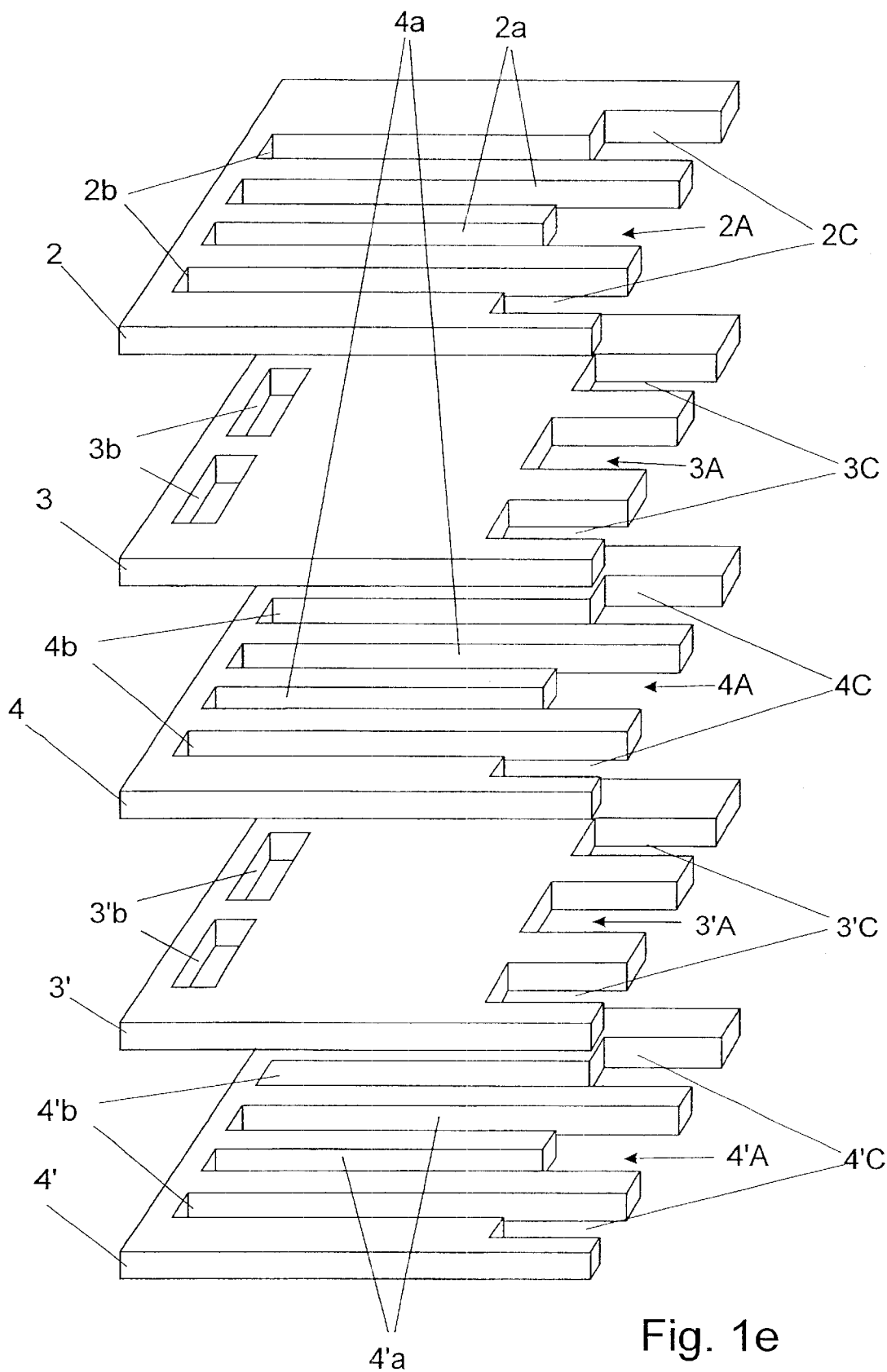
FIG. 1e shows a layer sequence in accordance with FIG. 1c, with a further separating layer and a further layer for accommodating the groups of channels.

The microchannel structural layer 4' which is additionally present in the layer sequence shown in FIG. 1e when compared to the embodiment shown in FIG. 1c is separated from the microchannel structural layer 4 by a further separating layer 3'. The resulting difference in terms of flow is determined by the fact that the cooling liquid from the channels 4a of the microchannel structural layer 4, which is now in the central plane, is divided into the connecting channels 3b of the upper separating layer 3 and the connecting channels 3'b of the lower separating layer 3'. The separated fractions of the cooling liquid combine on the one hand with fractions of the cooling liquid from the microchannels 2a and on the other hand with fractions from the microchannels 4'a before flowing through the respectively downstream groups of channels in the corresponding planes.

Figure 2A:
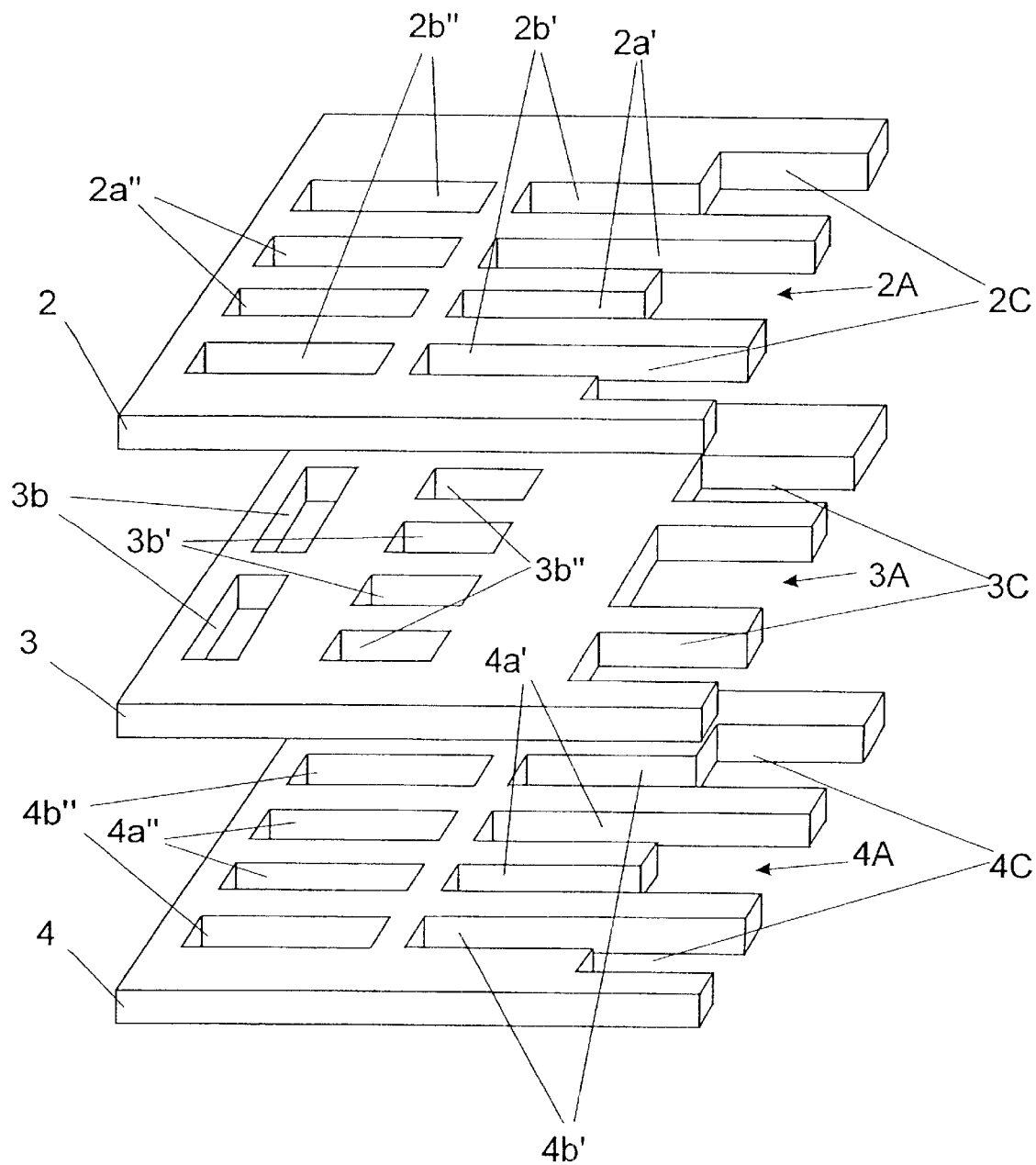
FIG. 2a shows an exploded view of a layer sequence for a microchannel heat sink in which the groups of channels are separated into subgroups.

The cooling layer sequence shown in FIG. 2a has been modified from the embodiments shown in FIG. 1c in that the groups of channels which, in that figure, are formed by the microchannels 2a and 4a, on the one hand, and 2b and 4b, on the other hand, are separated into subgroups of channels. Of the subgroups which are connected in series in terms of flow, first of all microchannels 2a' and 4a', which are in communication with the inlets 2A and 4A, are connected to microchannels 2a" and 4a" via common flow-connecting links in the intermediate layer 3, in the form of connecting channels 3b'. From here, the connecting channels 3b which were already present in the embodiment shown in FIG. 1c form a connection to microchannels 2b" and 4b', which in turn are coupled to microchannels 2b' and 4b' via connecting channels 3b'. Finally, the microchannels 2b' and 4b' open out into the outlets 2C and 4C.

Figure 2B:
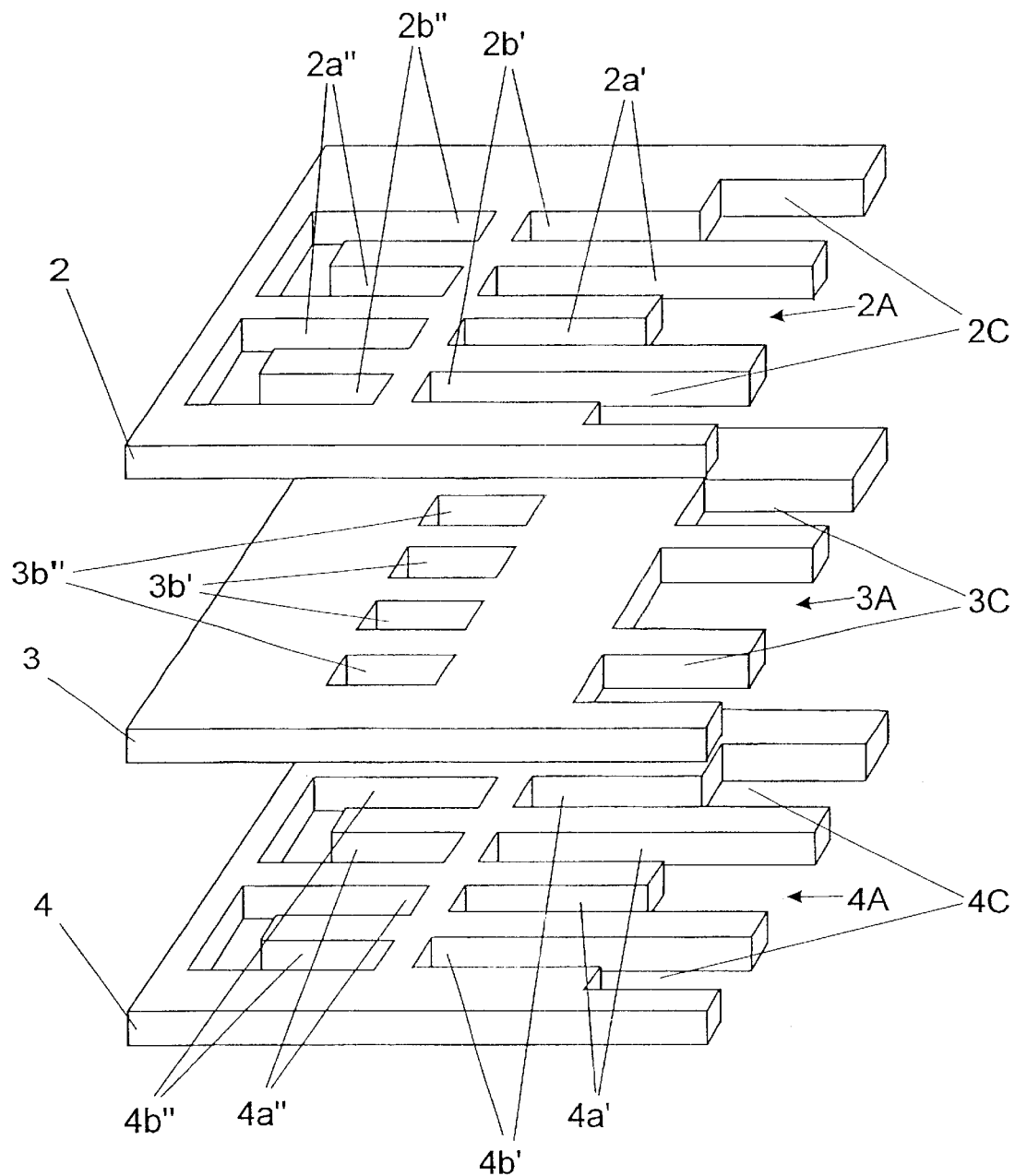
FIG. 2b shows a different design for a microchannel heat sink with groups of channels which are separated into subgroups.

The modification illustrated in FIG. 2b dispenses with some of the flow-connecting links. Instead, the microchannels 2a" and 4a" in their respective cooling microchannel layers 2, 4 pass directly into the microchannels 2b" and 4b", with the direction of flow being reversed.

Figure 3A:
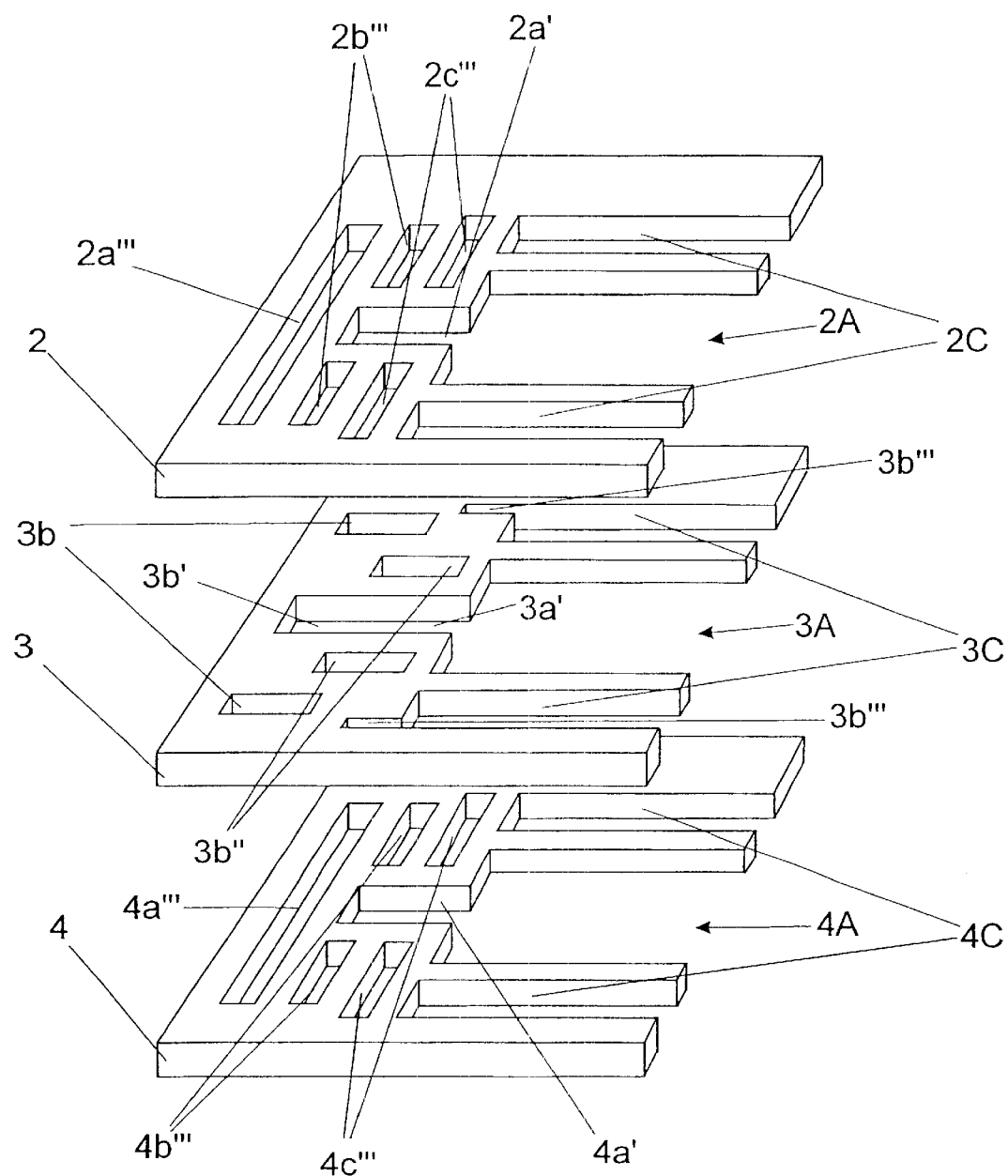
FIG. 3a shows an exploded view of a layer sequence for a microchannel heat sink with channels which are oriented transversely with respect to the direction of emission from the diode layer.

The layer sequence shown in FIG. 3a contains microchannels 2a''', 2b''', 2c''' and 4a''', 4b''', 4c'''. in the cooling microchannel layers 2, 4, in which microchannels the flow of cooling liquid runs transversely with respect to the direction of emission from the diode laser. Cooling liquid which enters via the inlets 2A, 3A and 4A is initially guided via microchannels 2a', 3a' and 4a' toward the attachment region for the object to be cooled and, via the common connecting channel 3b' which is a continuation of the microchannel 3a', passes into the microchannels 2a''' and 4a'''. Here, the flow of coolant is divided into two substreams which are directed outward from the center and, at the respective ends of the channel, open out into the common connecting channels 3b. Once it has passed through the microchannels 2b''' and 4b''', the cooling liquid passes into the microchannels 2c''' and 4c''' via further common connecting channels 3b'' and is finally discharged into the outlets 2C, 3C and 4C via connecting channels 3b'''.

Figure 3B:
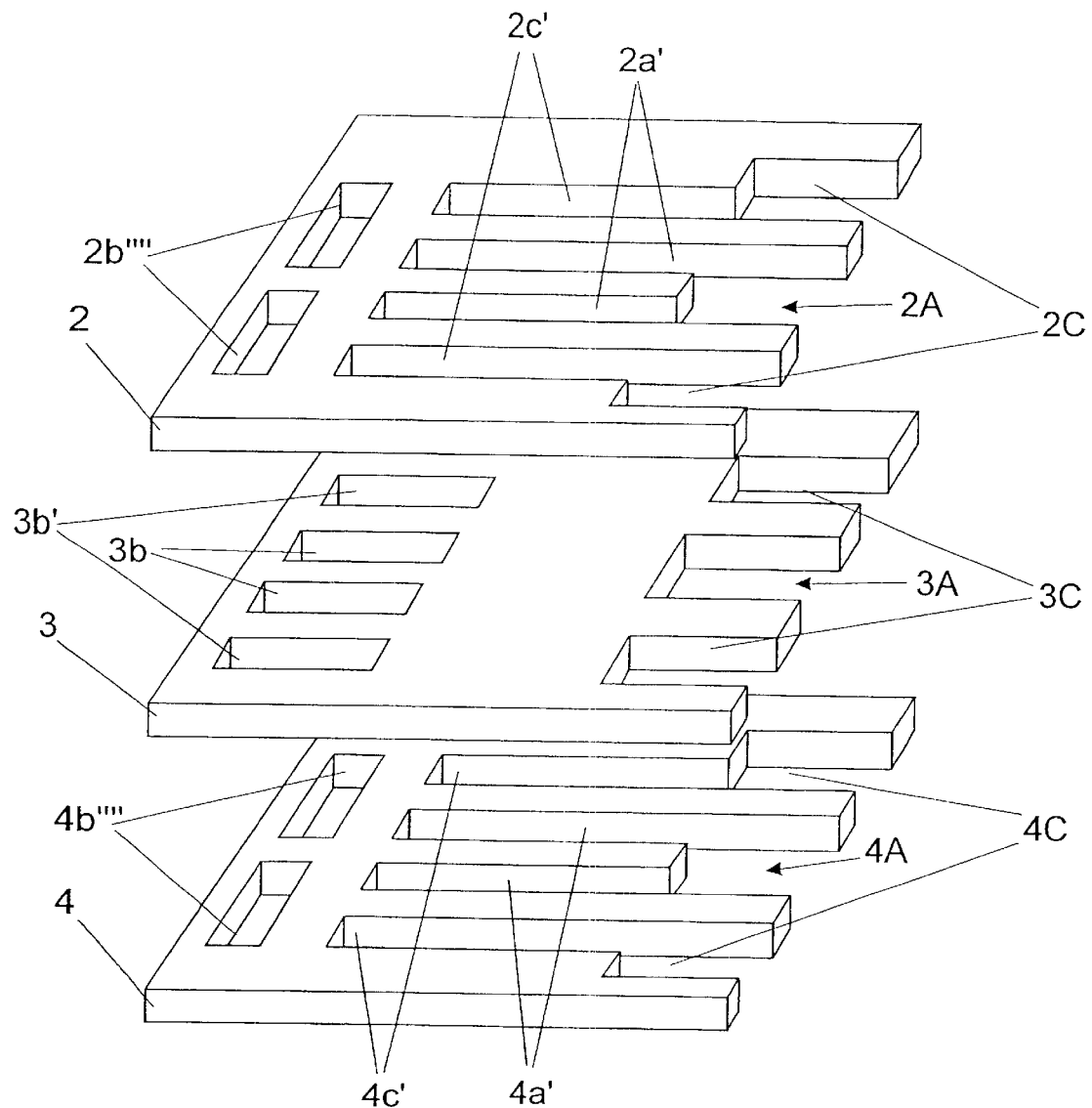
FIG. 3b shows another design for a microchannel heat sink with a combination of channels which are oriented longitudinally and transversely with respect to the direction of emission from the diode laser.

In the embodiment shown in FIG. 3b, the design of the microchannels means that the coolant is guided both in the direction of emission from the diode laser and perpendicular to this direction. Downstream of each of the microchannels 2a' and 4a' there are connected microchannels 2b"" and 4b"". via the connecting channels 3b situated in the intermediate layer, the microchannels 2a' and 4a' each forming a first group of channels and the microchannels 2b"" and 4b"" forming further groups of channels. While the channels of the first group have a longitudinal orientation toward the object to be cooled, the downstream group is oriented perpendicular thereto. A final group of channels, in the form of microchannels 2c' and 4c' which run parallel to the channels of the first group, is connected downstream of the microchannels 2b"", and 4b"" via connecting channels 3b' and is connected to the outlets 2C, 3C and 4C.

The coolant portions which are initially flowing separately from one another in the microchannels 2a' and 4a' are combined in the longitudinally oriented connecting channels 3b of the separating layer 3 and are then branched again into the transversely oriented microchannels 2b"" and 4b"". Downstream of the channels 2b"" and 4b"", the coolant portions are combined again in the connecting channels 3b' and ultimately branch into the microchannels 2c' and 4c' of the cooling microchannel layers 2 and 4.

The flow of coolant for the embodiments shown in FIGS. 1a to 3b can be understood more easily with reference to FIG. 4.

The layers 1, 1', 2, 2', 3, 3', 4, 4' and 5 should contain or consist of materials with an extremely high thermal conductivity, such as for example copper, diamond, boron nitride or silicon carbide. To achieve a coefficient of thermal expansion which is similar to that of GaAs, these materials may be combined in the same layers or other layers with one another or with other materials with a high thermal conductivity, such as tungsten, molybdenum or aluminum nitride.

While the foregoing description and drawings represent the preferred embodiments of the present invention, it will be obvious to one skilled in the art that various changes and modifications may be made therein without departing from the true spirit and scope of the present invention.

What is claimed is:

1. A device for cooling diode lasers, comprising:

channels which are arranged in superimposed planes and through which a cooling liquid flows;

said channels in each plane being divided into groups which are flow-connected in series with one another and, in order to be connected in series, open out into flow-connecting links which are common to the superimposed planes; and a first group of said groups of channels being in communication with a common inlet and another group of said group of channels, which is the last group in the series, being in communication with a common outlet for the cooling liquid.

2. The device as claimed in claim 1, comprising that said channels which are arranged in superimposed planes are formed in layers, between which there is a separating layer having common flow-connecting links.

3. The device as claimed in claim 2, comprising that the flow-connecting links are designed as channels which are relevant for the cooling aspect and are arranged in the region where the main introduction of heat occurs.

4. The device as claimed in claim 3, comprising that the groups of channels are formed in the superimposed planes for flows of coolant which are oriented parallel to one another.

5. The device as claimed in claim 4, comprising that the groups of channels are designed for a flow of coolant which is oriented parallel to the direction of emission from the diode laser.

6. The device as claimed in claim 4, comprising that the groups of channels are designed for a flow of coolant which is oriented perpendicular to the direction of emission from the diode laser.

7. The device as claimed in claim 2, comprising that the groups of channels in the superimposed planes are designed, at least in parts, for flows of coolant which are oriented perpendicular to one another, one of the flows of coolant running in the direction of emission from the diode laser.

8. The device as claimed in claim 2, comprising that the layers which contain the groups of channels are covered by covering layers, of which an upper covering layer is provided with a step in a region for attachment of the diode laser.

9. The device as claimed in claim 2, comprising that the layers which contain the groups of channels are covered by covering layers, of which an upper covering layer bears an additional layer for attachment of the diode laser.

10. The device as claimed in claim 9, comprising that the covering layer beneath the additional layer projects so as to form a step.

11. The device as claimed in claim 2, comprising that the layers are formed as multiple layers in order to increase the height of the channels.

12. The device as claimed in claim 11, wherein at least one of the layers contains materials selected from the group consisting of diamond, aluminum nitride, boron nitride, silicon carbide, molybdenum, tungsten and copper.

* * * * *